United States Patent [19]

Ogino et al.

[11] Patent Number: 5,053,724
[45] Date of Patent: Oct. 1, 1991

[54] HIGH PRECISION PLL WITH CIRCUIT FOR PREVENTING ERRONEOUS CAPTURE

[75] Inventors: Masanori Ogino; Takeo Yamada; Miyuki Ikeda, all of Yokohama, Japan

[73] Assignee: Hitachi, Ltd., Tokyo, Japan

[21] Appl. No.: 530,183

[22] Filed: May 29, 1990

[30] Foreign Application Priority Data

May 29, 1989 [JP] Japan .................................. 1-132602

[51] Int. Cl.⁵ ............................................. H03L 7/093
[52] U.S. Cl. ....................................... 331/14; 331/17; 331/20; 331/25
[58] Field of Search ....................... 331/14, 17, 20, 25

[56] References Cited

U.S. PATENT DOCUMENTS 2,912,651 11/1959 Leeds ...................................... 331/17
3,572,244 9/1973 Giger ....................................... 331/17

Primary Examiner—Siegfried H. Grimm
Attorney, Agent, or Firm—Antonelli, Terry, Stout & Kraus

[57] ABSTRACT

In a high prrecision PLL circuit arrangement, a phase detecting circuit produces a detecting signal which is directly proportional to a phase difference between a horizontal synchronizing signal and a voltage-controlled oscillating signal. A loop filter circuit produces a delay signal for delaying a frequency control at a predetermined time constant in response to the detecting signal derived from the phase detecting circuit. A voltage-controlled oscillating circuit produces an oscillating signal having a frequency directly proportional to a voltage of the delay signal from the loop filter circuit. A non-linear circuit includes a non-linear element for changing at least one of an AC gain and a DC gain of the loop filter circuit, and prevents an erroneous capture phenomenon of the PLL circuit arrangement in response to the detecting signal from the phase detecting circuit.

11 Claims, 10 Drawing Sheets

HIGH PRECISION PLL WITH CIRCUIT FOR PREVENTING ERRONEOUS CAPTURE

BACKGROUND OF THE INVENTION

The present invention relates to a high precision PLL (phase-locked loop) circuit arrangement suitable for a horizontal PLL circuit of a multi-scanning type display.

As described in "Television Engineering Handbook" written by D.G. Fink issued by McGraw-Hill Book Company, pages 7-22, 1957, a conventional PLL circuit arrangement for a horizontal AFC (automatic frequency control) of a CRT (cathode-ray tube) display has employed such a basic arrangement as shown in FIG. 1. In the circuit shown in FIG. 1, reference numeral 1 indicates an input horizontal synchronizing signal "HD", reference numeral 2 denotes a phase detector, reference numeral 3 represents a loop filter, and reference numeral 4 is a voltage-controlled oscillator "VCO".

In conventional PLL circuit arrangements, it has been known that the more a loop gain of a PLL circuit is increased, the more a residual phase deviation is decreased and also the more a capture range is enlarged. However, there is no clear quantitative analysis as to an achievable limit. This is because the satisfactory capture range of the conventional PLL circuit is rather narrow, say 15,734 KHz±100 Hz.

However, in accordance with progress in a high precision television technique and computer technology developed very recently, a higher need exists for a so-called "multi-scanning type display" capable of displaying a signal source having a wide range approximately from 15 KHz to 100 KHz. Furthermore with respect to precision of a display position of a display screen, very high precision, e.g., 1/100 of a screen size, has been required.

It is extremely difficult to construct such a high precision multi-scanning type display by way of the conventional techniques In other words, no embodiment of the high precision multi-scanning type display has been constructed.

SUMMARY OF THE INVENTION

It is an object of the present invention to provide a high precision multi-scanning type CRT display.

More specifically, another object of the present invention is to provide a high precision PLL circuit arrangement employed in a wide band continuous following type horizontal AFC which constitutes a major portion of a multi-scanning type display.

To achieve the objects, in accordance with the present invention, first of all, a quantitative analysis is made of the capture limit of a general PLL circuit. Thereafter, another quantitative analysis is made of an erroneous capture phenomenon specific to the wideband PLL circuit. Furthermore, an erroneous capture preventing means is represented which utilizes a non-linear circuit designed based on the quantitative analysis results of both the general PLL circuit and the wideband PLL circuit.

The erroneous capture preventing means is to limit a holding range of the PLL circuit arrangement at the capture stage. A departure from the erroneous capture state can be achieved by limiting the holding range.

After the capture has been accomplished, this erroneous capture means is operated so as to utilize the great DC loop gain of the PLL circuit arrangement. As a result, reduction of the normal residual phase deviation may be achieved. Since the precision of the screen display position depends upon the normal residual phase deviation, the high precision of the display position may be achieved by reducing this residual phase deviation.

DESCRIPTION OF THE PREFERRED EMBODIMENTS

First, a capture range of a general-purpose PLL (phase-locked loop) circuit will now be analyzed.

Figure 2:
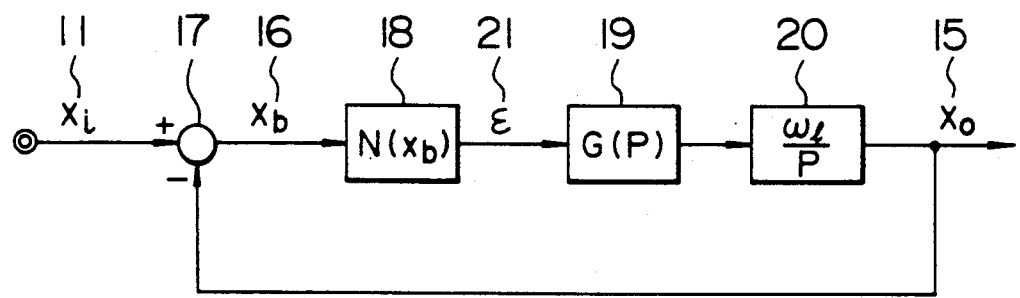
FIG. 2 is a schematic block diagram of the general PLL circuit.

In FIG. 2, there is shown an arrangement of a general, or normal PLL circuit. Reference numeral 11 indicates an input phase $X_i$, reference numeral 16 denotes a beat phase $X_b$, reference numeral 17 represents a subtracter. As a consequence, the following equation is satisfied:

$$X_b = X_i - X_o \qquad (1)$$

Figure 3:
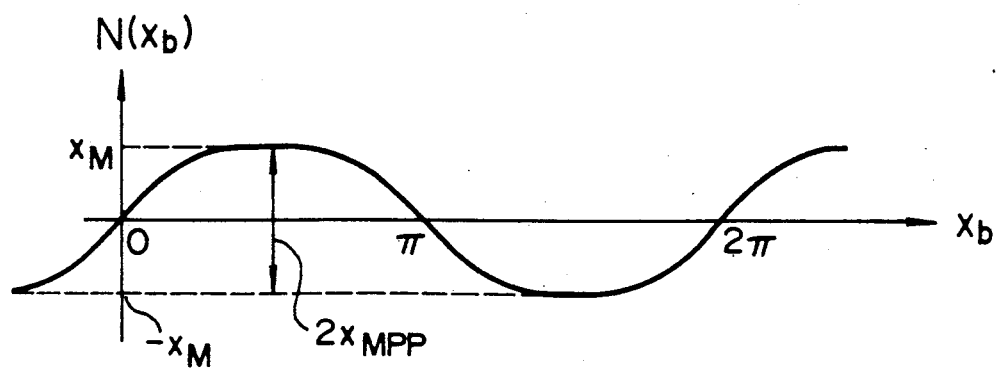
FIG. 3 represents a phase detection characteristic of a phase detector shown in FIG. 2.

Reference numeral 18 shown in FIG. 2 indicates a block to describe a non-linearity of a phase detector, an input/output characteristic of which is expressed as follows:

$$\epsilon = N(X_b) \, E[-X_M, X_M] \qquad (2)$$

where $N(X_b)$ is a function having such a form as shown in, for example, FIG. 3, and a maximum value thereof and a minimum value thereof are expressed by $+X_M$ and $-X_M$, respectively.

As represented in FIG. 3, $N(X_b)$ is equal to a periodic function in which $2\pi$ corresponds to a period.

Then, reference numeral 19 in FIG. 2 indicates a loop filter, the transfer function of which is $G(p)$. "P" is equal to a complex angular frequency "$j\omega$". Reference numeral 20 indicates a voltage-controlled oscillator (simply referred to as a "VCO"). A transfer function of this VCO is $\omega_1/p$, where an integration element of $1/p$ implies that an output angular frequency is controlled based upon information on a difference in an input phase, and "$\omega_1$" is equal to a proportional constant thereof. In case that a gradient of the $N(X_b)$ characteristic, shown in FIG. 3, near an origin is equal to 1, and the transfer function $G(p)$ of the loop filter is equal to 1, the proportional constant "$\omega_1$" is equal to a so-called "angular frequency loop gain".

Step 1—First order

First, an input/output characteristic of the first order will now be summarized as to such a case $G(p)=1$, namely no loop filter.

Figure 4:
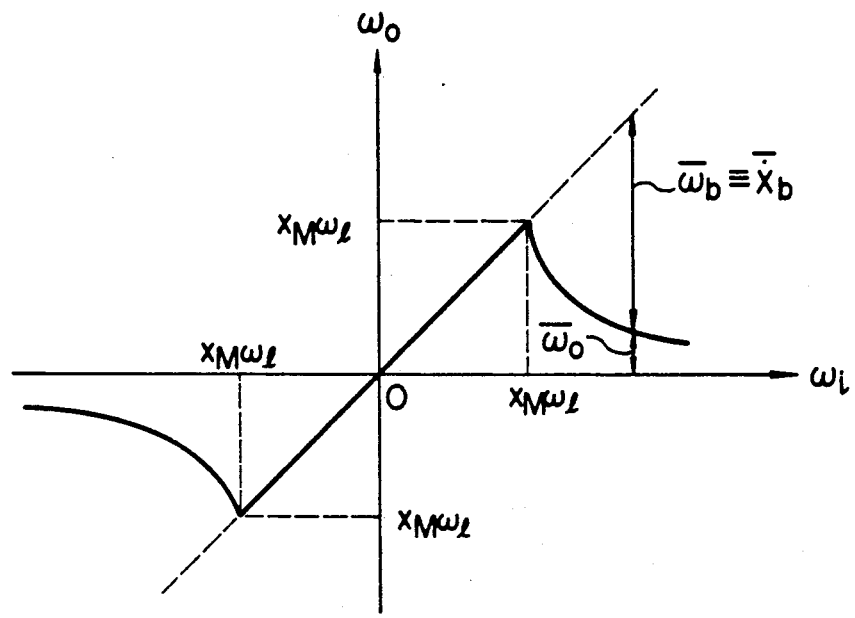
FIG. 4 represents an input/output characteristic of a loop filter when the loop filter shown in FIG. 2 is of the first order.

The input/output characteristic of the first order is represented in FIG. 4. An abscissa "$\omega_i$" of FIG. 4 indicates deviation in an input angular frequency, whereas an ordinate "$\overline{\omega_o}$" thereof denotes a mean value of deviation in an output angular frequency. It should be noted that the deviation is defined in such a manner that the output angular frequency of VCO is employed as a reference when the input of VCO 20 is equal to zero. As indicated by a solid line of FIG. 4, within a region of $$|\omega_i| \leq X_M \omega_1$$

"$\omega_o$" is identical with "$\omega_i$." However, within another range of $$|\omega_i| > X_M \omega_1$$

$|\omega_o|$ becomes smaller than $|\omega_i|$ and the following relationship may exist:

$$\overline{\omega_o} = \omega_i - \overline{\omega_b} \qquad (3)$$

where $\overline{\omega_b}$ = a mean value of time of $\omega_b$, $$\omega_b = \dot{X}_b = dX_b/dt$$

and "t" is time.

When $\overline{X_b}$ is analytically obtained as a function of $\omega_i$, a form of $\overline{\omega_o}(\omega_i)$ is accordingly obtained.

$\overline{X_b}(\omega_i)$ is calculated based upon the above-described equations 1 and 2, and also $G(p) \equiv 1$ represented in FIG. 2. When the equation (1) is differentiated, the following results are obtained:

$$\frac{dX_b}{dt} = \omega_b = \omega_i - \omega_o$$
$$= \omega_i - N(X_b) \omega_1$$
$$= \omega_i - n \, \omega_{AC}$$

where $$\begin{cases} \omega_{AC} = X_M \omega_1 \\ n = \dfrac{N(X_b)}{X_M} \\ |n| \leq 1 \end{cases} \qquad (4)$$

As a result, $$dt = \frac{dX_b}{\omega_i \left(1 - \dfrac{\omega_{AC}}{\omega_i} n \right)} \qquad (5)$$

Then, the beat period "$T_b$" is calculated as follows, in case of $\omega_{AC} << \omega_i$:

$$= \int_0^{2\pi} \frac{1}{\omega_i} \left\{ 1 + \frac{\omega_{AC}}{\omega_i} n + \left(\frac{\omega_{AC}}{\omega_i} n\right)^2 + \ldots \right\} dX_b \qquad (6)$$

$$= \frac{2\pi}{\omega_i} \left\{ 1 + \frac{\omega_{AC}}{\omega_i} \overline{n} + \left(\frac{\omega_{AC}}{\omega_i}\right)^2 \overline{n^2} + \ldots \right\}$$

where $\overline{n}$ is an average value of $n$ with respect to "$X_b$", and $\overline{n^2}$ is an average value of $n^2$ with respect to "$X_b$".

In accordance with the above-described equation, both $\overline{\omega_b}(\omega_i)$ and $\overline{\omega_o}(\omega_i)$ are obtained as follows:

$$\overline{\omega_b} = \frac{\omega_i}{1 + \dfrac{\omega_{AC}}{\omega_i} \overline{n} + \left(\dfrac{\omega_{AC}}{\omega_i}\right)^2 \overline{n^2} + \ldots}$$

$$\approx \omega_i \left\{ 1 - \frac{\omega_{AC}}{\omega_i} \overline{n} - \left(\frac{\omega_{AC}}{\omega_i}\right)^2 (\overline{n^2} - \overline{n}^2) \right\}$$

$$\overline{\omega_o} = \omega_i - \overline{\omega_b} \qquad (7)$$

$$\approx \omega_{AC} \overline{n} + \frac{\omega_{AC}^2}{\omega_i} \sigma^2$$

where $\sigma^2 \equiv \overline{n^2} - \overline{n}^2$ $\sigma^2$ of the above-described equation (7) implies "n", that is to say, the dispersion of N(xb), i.e., the phase detecting characteristic of FIG. 3 which has been standardized with the above described equation (4). Also, the average value "n" is equal to zero when N(xb) corresponds to a symmetrical relation for positive and negative fields.

Based upon the above-described equation (7), the capture range when there is a loop filter G(p) will now be analyzed.

Step 2—Second Order

Assuming now that $\tau_1$ and $G_o$ are constants, and the form of the loop filter is given by:

$$G(p) = \frac{1 + \tau_1 p}{1/G_o + \tau_1 p} \tag{8}$$

where $\tau_1 \omega_1 >> 1$ and $G_o >> 1$, the capture range will be determined as follows.

Figure 5:
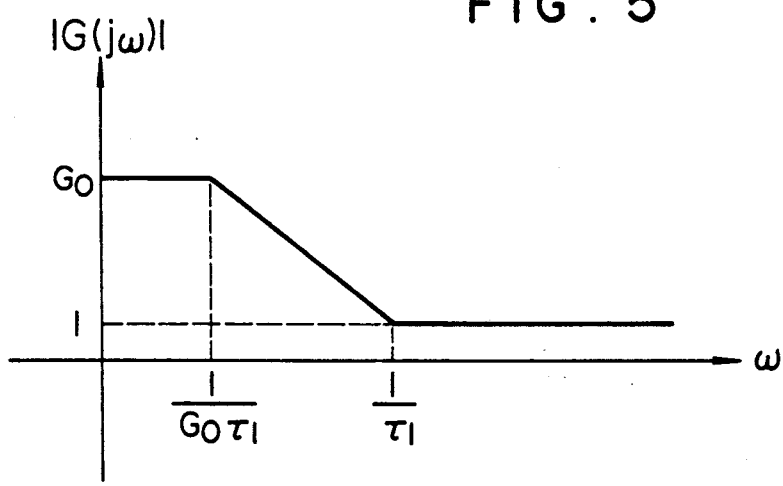
FIG. 5 is a Bode diagram when the loop filter shown in FIG. 2 is of the second order.

A Bode diagram of the formula (8) is represented in FIG. 5, and is similar to the characteristic of the PLL filter shown in FIG. 2≈3. As apparent from FIG. 5, a DC gain of G(p) is equal to "$G_o$" and an AC gain thereof is equal to "1".

Now, an analysis will be made of how to correct the input/output characteristic of the second order: $\overline{\omega_o}(\omega_i)$ in accordance with a quantity of an increase in the DC gain: $\Delta G_o \equiv G_o - 1$. To avoid confusion, functions of "F" and "$F_{2s}$" will now be defined as follows:

$$\overline{\omega_o} = F(\omega_i) - f \text{ or } G_o = 1$$

As described in Step 1, $$\overline{\omega_{o\infty}} = F_\infty(\omega_{i\infty}) - f \text{ or } G_o >> 1$$

where $\omega_{i\infty}$ is equal to deviation in a real input angular frequency of the second order shown in FIG. 2, whereas $\overline{\omega_{o\infty}}$ is equal to deviation in a final output angular frequency of the second order represented in FIG. 2.

To grasp the form of "$F_\infty$" in connection with the form of "F", let us consider them in conjunction with a common averaged beat angular frequency $\overline{\omega_b}$.

First of all, $\overline{\omega_o}$ must become a value $G_o$ times higher than the value of $\overline{\omega_o}$ with respect to the above described common $\omega_b$. That is to say;

$$\overline{\omega_o} = \frac{\omega_{o\infty}}{G_o} \tag{9}$$

On the other hand, the above-described Step 1 to produce the above common $\overline{\omega_b}$, namely deviation $\omega_i$ in a virtual input angular frequency of the first order must satisfy the below-mentioned equation:

$$\omega_i = \omega_{i\infty} - \overline{\omega_o} \Delta G_o \tag{10}$$

where $\Delta G_o \equiv G_o - 1$: an increase in a DC gain.

The last term of the above-described equation, $\overline{\omega_o} \Delta G_o$ corresponds to an offset value of a center angular frequency of the VCO which is produced by an increase in an average DC voltage of a VCO input that is caused by the DC gain increase $\Delta G_o$ in G(P) shown in FIG. 2.

In other words, although the deviation in real input angular frequency is equal to $\omega_{i\infty}$, the deviation in the virtual first order input angular frequency is reduced by the above-described offset value. By substituting the definition formula of F with the equations (9) and (10), the following equation is obtained.

$$\omega_o = \frac{\overline{\omega_{o\infty}}}{G_o} = F\left(\omega_{i\infty} - \frac{\overline{\omega_{o\infty}}}{G_o} \Delta G_o\right) \tag{11}$$

Then, the above-described equation must satisfy the relationship between $\omega_{i\infty}$ and $\overline{\omega_o}$, namely must give the form of $F_\infty$.

Figure 6:
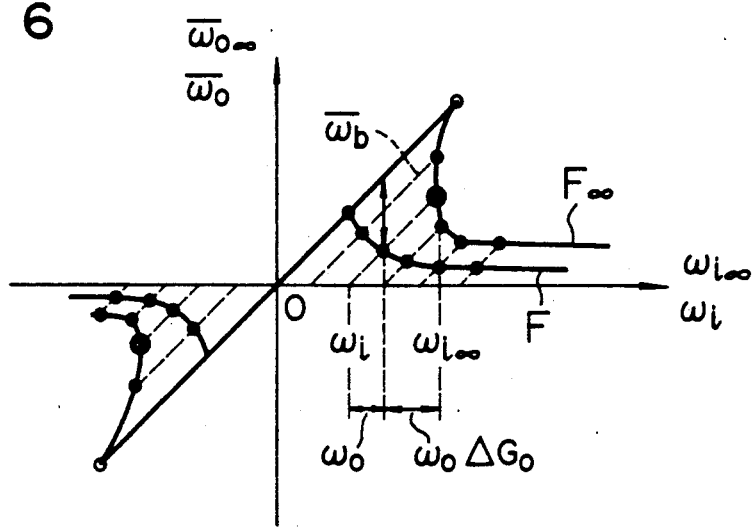
FIG. 6 represents an input/output characteristic of a loop filter when the loop filter shown in FIG. 2 is of the second order.

In FIG. 6, there is shown the equation (11) representative of the steps for obtaining $F_\infty$ from the form of "F". A symbol ⊙ shown in FIG. 6 indicates a capture limit. $\overline{\omega_{i\infty}}$ corresponding thereto is obtained by differentiating the equation (11) with respect to $\overline{\omega_{o\infty}}$ and by solving $$\frac{d\omega_{i\infty}}{d\overline{\omega_{o\infty}}} = 0$$

As a result, $$\frac{1}{G_o} = \frac{dF(\omega_i)}{d\omega_i} \cdot \frac{d\left\{\omega_{i\infty} - \frac{\omega_{o\infty}}{G_o} \Delta G_o\right\}}{d\overline{\omega_{o\infty}}} \tag{12}$$

$$= -F'(\omega_i) \cdot \frac{\Delta G_o}{G_o}$$

$$\therefore -F'(\omega_i) = \frac{1}{\Delta G_o}$$

where $$F'(\omega_i) \equiv \frac{dF(\omega_i)}{d\omega_i}$$

Accordingly, from the above-described equation (12), the following equation (13) is given:

$$\overline{\omega_o} = F(\omega_i) = \omega_{AC} \overline{n} + \frac{\omega_{AC}^2}{\omega_i} \sigma^2 \tag{13}$$

Accordingly, from the above-described equation (12), the following equation is obtained:

$$\left(\frac{\omega_{AC}}{\omega_i} \sigma\right)^2 = \frac{1}{\Delta G_o} \tag{14}$$

$$\therefore \omega_i = \omega_{AC} \sigma \sqrt{\Delta G_o}$$

With the above described equations, "$\omega_i$" represented in FIG. 6 has been obtained. Then, the desirable capture limit $\omega_i$ is calculated from the above-described equations (10), (13) and (14):

$$\pm \omega_{i\infty} = \pm \omega_i + \overline{\omega_o} \Delta G_o \tag{15}$$

$$= \pm \omega_{AC} \sigma \sqrt{\Delta G_o} + \left(\omega_{AC} \overline{n} \pm \frac{\omega_{AC}^2}{\omega_{AC} \sigma \sqrt{\Delta G_o}}\right) \Delta G_o$$

$$= \pm 2\omega_{AC} \sigma \sqrt{\Delta G_o} + \omega_{AC} \overline{n} \Delta G_o$$

Since the above-described equation should be considered as an increase of the capture range of the second order with respect to the capture range ($\omega_{AC}$) of the first order, the capture range $\omega_p$ for the second order is expressed by the following equation:

$$\omega_p = \omega_{AC}(2\sigma\sqrt{\Delta G_o} + 1 \pm \bar{n}\Delta G_o) \tag{16}$$

where, $$\begin{cases} \omega_{AC} = X_M\omega_l \\ n = N(X_b)/X_M \\ \sigma^2 = \overline{n^2} - \bar{n}^2 \end{cases} \tag{4}$$

dispersion of "$n$"

In the above-described equation (16), "$\omega_{AC}$" should be within an AC control range in the general PLL circuit shown in FIG. 2.

It should be noted that if the hold range of the general PLL circuit is selected to be "$\omega_h$", then "$\omega_h$" becomes $G_o$ times higher than "$\omega_{AC}$". As consequence, $$\omega_p \approx \omega_h\left(\frac{2\sigma}{\sqrt{G_o}} + \frac{1}{G_o} \pm n\right) \tag{17}$$

The above-described equation (16) is a general formula from which the capture range of the second order corresponding to an arbitrary characteristic $N(X_b)$ of the phase detector can be determined. In general, as $N(X_b)$ for the horizontal PLL circuit of the CRT display, a trapezoidal form shown in FIG. 7 may be used. $\sigma$ and $\bar{n}$ values corresponding to the trapezoidal form are obtained from the equations 4 and 7:

$$\sigma = \sqrt{1 - \frac{4X_M}{3\pi}} \approx 1 - \frac{2X_M}{3\pi} \tag{18}$$

$$\bar{n} = 0$$

The calculations are executed with respect to a sinusoidal form:

$$\sigma = \frac{1}{\sqrt{2}}$$

and with respect to a triangular form $$\sigma = \frac{2}{\sqrt{3}}$$

In general, since $X_M \leq 1$ in the horizontal PLL circuit of the CRT display, the last term of the equation may be omitted. As a consequence, the following equation may be satisfied:

$$\omega_p \approx \omega_{AC}(2\sqrt{\Delta G_o} + 1) \tag{19}$$

Also, stationary residual phase deviation of a system is given by the below-mentioned equation:

$$\epsilon = \frac{\omega_i X_M}{\omega_h} = \frac{\omega_i X_M}{G_o \omega_{AC}} = \frac{\omega_i}{G_o \omega_l} \tag{20}$$

-continued $$\therefore \omega_{AC} = X_M \omega_l \tag{4}$$

It is assertable that the capture range can be enlarged and the stationary deviation "$\epsilon$" can be reduced to near zero by increasing the DC gain "$G_o$" of the loop filter of the second order under such a limited condition given by the above-described equations (19) and (20). Consequently, it may be judged that the basis of the qualitative understanding which constitutes the background of prior art could by formularized by way of a generic form, i.e., the equation (16).

Third Step—Third Order

However, the practical PLL system must be of a third order, and not of a second order. This is because a carrier hold filter is required to be included in a loop filter. As a result, this fact cannot be neglected within a region where a ratio of a carrier angular frequency of a capture range, namely a rated capture range, is higher than 0.2.

Figure 8:
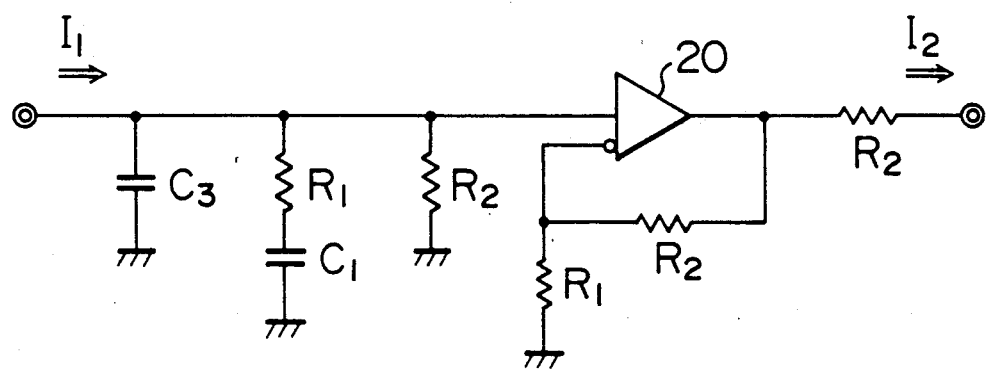
FIG. 8 represents an arrangement of a general loop filter of the third order.

A generic form of a loop filter containing a carrier hold filter is represented in FIG. 8. Reference numeral 20 of FIG. 8 indicates an operational amplifier. $C_1$ and $C_3$ indicate capacitors. $C_3$ denotes a carrier hold capacitor. A relationship between an input current $I_1$ and an output current $I_2$ is expressed as follows:

$$G(p) = \frac{I_2}{I_1} \approx \frac{1 + \tau_1 p}{\left(\frac{1}{G_o} + \tau_1 p\right)(1 + \tau_3 p)} \tag{21}$$

where $$\begin{cases} G_o = \frac{R_1 + R_2}{R_1}, \Delta G_o = \frac{R_2}{R_1} \\ \tau_1 = C_1 R_1 \\ \tau_3 = C_3 R_1 \\ R_2 >> R_1, C_3 << C_1 \end{cases}$$

Figure 9:
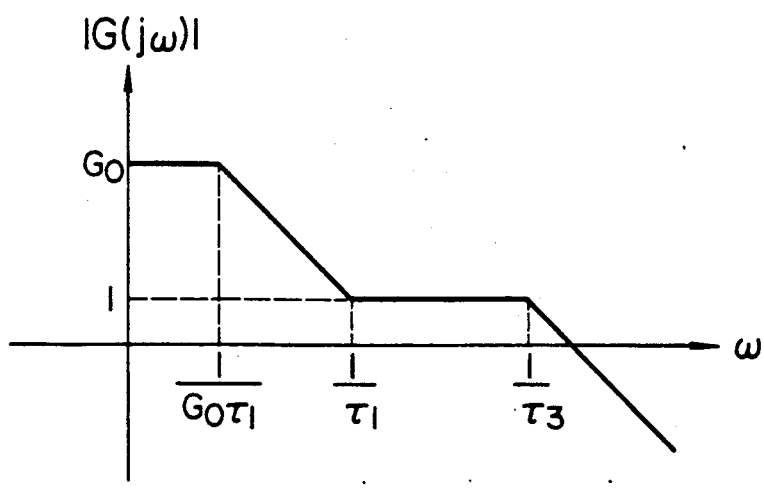
FIG. 9 is a Bode diagram of a general loop filter of the third order.

When the above-described equation (21) is compared with the previously-described equation (8), it can be understood that this equation has been changed into the third order by adding the term of $\tau_3$. A Bode diagram of this equation is represented in FIG. 9.

It should be noted that the time constant $\tau_3$ is selected to be approximately one half of the carrier period (one half of the horizontal scanning period in the horizontal PLL circuit). A time constant $\tau_3$ is selected to be approximately 30 microseconds in the multi-scanning type display, according to the present invention, which can cover a frequency range from 16 KHz to 100 KHz.

Based upon the above-described equation (21), a loop gain $G_{l(p)}$ of the general PLL circuit shown in FIG. 2 is as follows:

$$G_{l(p)} = \frac{(1 + \tau_1 p) \omega_l \cdot e^{-0.5 TMP}}{P\left(\frac{1}{G_o} + \tau_1 p\right)(1 + \tau_3 p)} \tag{22}$$

Since the denominator of the above-described equation (22) corresponds to a third order function of "P", this equation is of a "third order". In the equation (22), the term of 0.5 $T_H$ implies a delay element caused by a finite sampling period $T_H$ in the phase detector.

While the DC gain $G_o$ is increased so as to extend the capture range $\omega_p$, this capture range $\omega_p$ may be increased up to approximately ¼ of $\omega_H=2\pi/T_H$, i.e., the carrier angular frequency. However, this range cannot be increased to more than $\omega_H/4$. This is because a delay amount of the equation (22) becomes about 180°.

This is because 1/P is delayed at 90°, $\tau_{1P}$ of the numerator/denominator is canceled, $e^{-0.5 \tau HP}$ is delayed at approximately 45°, $(1+\tau_{3p})$ of the demoninator is also delayed at approximately 45° in the $\omega_H/4$ of the equation 22, and a delay amount of the equation 22 becomes about 180°. In such a case that $\tau_3$ is set to be smaller than 0.5 $T_H$ and reduced to near zero, the term of the sampling display in the equation 22 is deteriorated to be $e^{\tau HP}$ in view of the physical effects thereof and implication. As a consequence, the total delay amount becomes 180°.

Under the delay state of 180°, the PLL circuit does not represent the negative feedback effect, but represents the positive feedback effect. Thus, such a capture range higher than $\pm\omega_H/4$ cannot be realized.

Although a detailed explanation on a procedure is omitted, the capture range of the third order is given by the following equation, in accordance with the analysis results made by the inventors:

$$\omega_p \approx \omega_{AC}(2\sigma \sqrt{\Delta G_o} + 1)\left(1 - \frac{\theta}{\pi}\right) \quad (23)$$

Where, $$\begin{cases} \theta \approx \frac{1}{\omega_i \tau_1} + \omega_i \tau_d \left(1 \pm \frac{2\pi\bar{n}}{\omega_{AC}\tau_d}\right) \\ \tau_d = \tau_3 + 0.5\ T_H \\ \omega_i = \sigma\ \omega_{AC} \sqrt{\Delta G_o}, \sqrt{\Delta G_o} \gg 1 \end{cases}$$

In the above-described equation (23), "$\theta$" corresponds to an amount calculated by subtracting $\pi/2$ from the delay amount of the third order at the angular frequency $\omega_i$. When the phase detecting characteristic $N(X_b)$ is symmetrical with respect to a vertical direction of a graph ($\bar{n}=0$), the value of this "$\theta$" is expressed by the following equation together with a phase margin "$\theta_M$" in $\omega_i$ of the third order:

$$\theta = \frac{\pi}{2} - \theta_M \quad (24)$$

Figure 10:
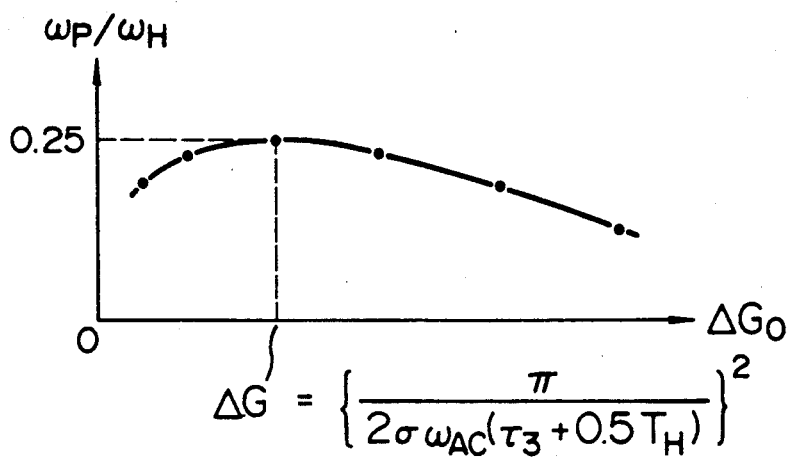
FIG. 10 represents a relationship between a DC gain of a loop filter and a capture range.

In accordance with the above-described equation (23), the capture range $\omega_P$ is given as functions of the respective parameters in the general PLL circuit shown in FIG. 2. In particular, FIG. 10 represents how the capture range $\omega_p$ depends upon the DC gain increase of the loop filter $\Delta G_o$ in case of $\bar{n}=0$. An abscissa of FIG. 10 indicates an increase of a DC gain $\Delta G_o$, whereas an ordinate thereof indicates a ratio of a capture angular frequency $\omega_p$ to a horizontal angular frequency $\omega_H$. As apparent from FIG. 10, the capture range $\omega_p$ cannot exceed over approximately 0.25 $\omega_H$ under such a condition that a value of $(\tau_3+0.5\ T_H)$ is substantially equal to the horizontal period $T_H$ which is well known as a realistic fact.

$$\begin{cases} \omega_p \approx 0.25\ \omega_H \\ \cdots \sqrt{\Delta G_o} = \frac{\pi}{2\sigma\omega_{AC}(\tau_3 + 0.5\ T_H)} \\ \approx \frac{\omega_H}{4\sigma\omega_{AC}} \end{cases} \quad (25)$$

Now, the above-described third step will be summarized. Since a carrier hold filter is required in a practical PLL circuit, this circuit becomes of a third order. When the DC gain increase: $\Delta G_o$ is increased in the third order circuit, the capture range $\omega_p$ is increased directly proportional to $\sqrt{\Delta G_o}$ at the beginning, similar to the second order circuit. However, under the conditions of the equation 25, the capture range becomes maximum and thereafter is decreased when $\Delta G_o$ is furthermore increased. It is a novel fact that while $\Delta G_o$ is increased, the capture range $\omega_p$ is reduced, which is opposite to the conventional common sense. Such a conventional common sense may be regard as a fact that theoretical analysis and implementation of the capture range have been effected only within a region of 0.1 $\omega_H$.

Figure 7:
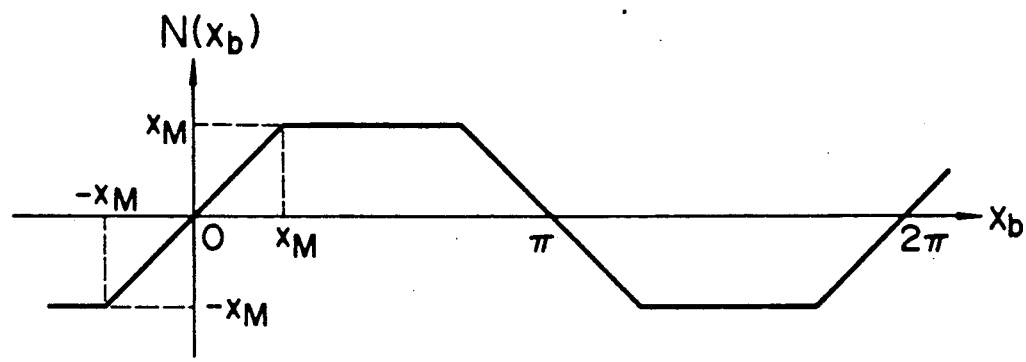
FIG. 7 indicates a trapezoid phase detecting characteristic of a phase detector.

It should be noted that although an assumption was made that $\bar{n}$ was equal to zero (implying that the average value of $N(X_b)$ shown in FIG. 7 becomes zero, namely has symmetry in the vertical direction) when the maximum capture range condition of the equation (25) is conducted, another maximum capture range condition may be conducted with the employment of a non-zero $\bar{n}$ value:

$$\begin{cases} \omega_p \approx \frac{0.25\ \omega_H}{1 \pm \frac{\omega_H}{\omega_{AC}} \cdot n} \\ \cdots \sqrt{\Delta G_o} \approx \frac{\omega_H}{4\sigma\omega_{AC}} \cdot \frac{1}{1 \pm \frac{\omega_H}{\omega_{AC}} \cdot \bar{n}} \end{cases} \quad (26)$$

As seen from the equation (26), when a waveform of $N(X_b)$ of the phase detector is asymmetrical in a vertical direction, the capture range becomes unbalanced.

The description of the third step has been accomplished, and now an erroneous capture phenomenon will be explained.

Fourth Step—Erroneous Capture Phenomenon

As a result of experimental considerations of an enlargement of a capture range for a PLL circuit with employment of such a phase detector having a trapezoidal $N(X_b)$ effected by the inventors, an erroneous capture phenomenon at $\omega_H \pm 0.2\ \omega_H$ was discussed. Under such an erroneous capture phenomenon condition, an output frequency of the VCO becomes $\omega+0.2\ \omega_H$ or $\omega_H-0.2\ \omega_H$, although an input angular frequency is equal to $\omega_H$.

Figure 11:
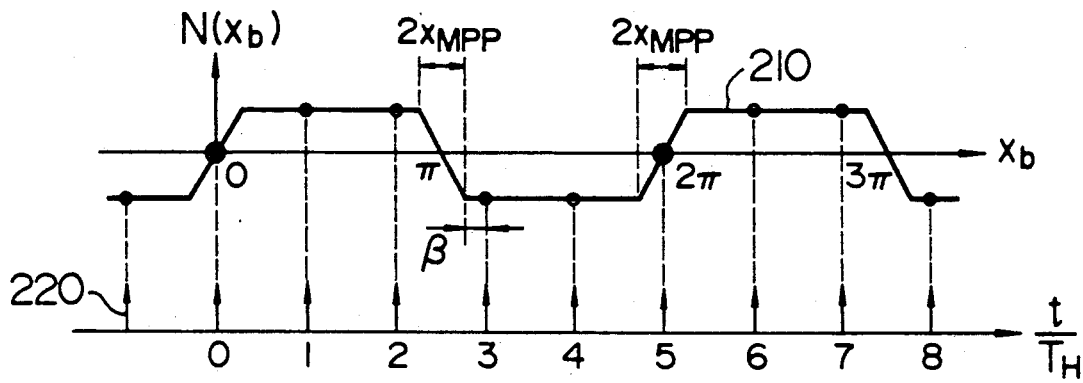
FIG. 11 indicates a principle of an erroneous capture holding condition by a PLL circuit.

A principle of this erroneous capture holding condition is represented in FIG. 11. Reference numeral 220 of FIG. 11 indicates a pulse position of an input horizontal synchronizing signal with an arrow, corresponding to an input phase of FIG. 2. An abscissa of a waveform 210 represents a time "t" as a unit of a horizontal scanning period $T_H$. A waveform 210 shown in FIG. 11 indicates a graphic representation of a phase detecting output N($X_b$) in which a beat phase $X_b$ is represented on an ordinate. FIG. 11 shows that an input angular frequency is $\omega_H$ and an output angular frequency is 0.80 $\omega_H$. In this case, since a beat angular frequency, namely a difference in the input/output angular frequencies becomes 0.20 $\omega_H$, as represented in FIG. 11, a parallel relationship can be established between the abscissa "$X_b$" and the time "t". However, as apparent from FIG. 11, one pulse among the five input horizontal synchronizing signals is positioned at a negative feedback operating point shown by a double circle in FIG. 11. As a result, this condition is held by the PLL circuit.

To avoid such an erroneous capture phenomenon, it is useful to select a width of a gradient $2X_{MPP}$ of a trapezoidal N($X_b$) waveform to be near $2\pi/5$ radians. This is because such a selection causes the horizontal pulses positioned at times 3 and 8 shown in FIG. 11 to be entered into the positive feedback operating points. If the horizontal pulses enter into the positive feedback regions, since the PLL circuit is operated in such a manner that this PLL circuit escapes from this condition, the above-described erroneous capture phenomenon can be prevented.

Figure 12:
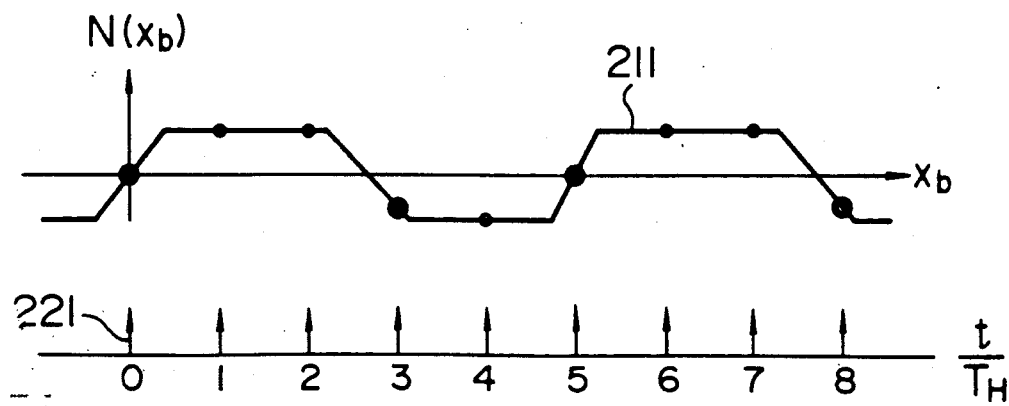
FIG. 12 indicates a principle of an erroneous capture prevention by a PLL circuit.

In FIG. 12, there is shown an example where an erroneous capture phenomenon can be avoided. Waveforms 211 and 221 shown in FIG. 12 correspond to the previous waveforms 210 and 220 shown in FIG. 12, respectively. FIG. 12 represents such an example that phase detecting outputs corresponding to the times 3 and 8 have entered into the positive feedback region.

As a result of the experiment, the width of the gradient portion $2X_{MPP}$ in the trapezoidal phase detecting characteristic needs not be precisely selected to be $2\pi/5$ radians. Alternatively, if this width is selected to be higher than 80% of this $2\pi/5$ radians, the erroneous capture phenomenon of $\omega_H \pm \omega_H/5$ can be prevented.

Although the above-description has been made of the erroneous capture phenomenon of $\omega_H \pm \omega_H/5$, other erroneous capture phenomenon such as $\pm \omega_H/7$ and $\pm \omega_H/9$ may be similarly prevented. It should be noted that since capture force is weak in these regions, it is a very rare case that the erroneous capture phenomenon occurs.

In case of a multiplier type phase detector normally employed in a horizontal PLL circuit, the width of the gradient portion $2X_n$ of the trapezoidal phase detection characteristic is equal to a pulse width of an input horizontal synchronizing signal being represented in units of radians.

However, the pulse width of this input horizontal synchronizing signal is smaller that $2\pi/5$ radians, say is equal to on the order of 0.6 radians. As a result, there may be problem in an erroneous capture phenomenon to the above-described $(1 \pm 0.2)f_H$.

Assuming now that the model of the second order as previously described in the step 2 is employed, this erroneous holding cancel condition is theoretically obtained. In the general PLL circuit shown in FIG. 2, an assumption will now be made that the phase detection characteristic: N($X_b$) represents a trapezoidal form as shown in FIG. 7, and the loop filter G(p) is of a second order as previously described in FIG. 5.

In general, a potential erroneous holding mode is characterized by such a condition that a beat angular frequency under the erroneous holding state is equal to an input angular frequency $\omega_H$ divided by an arbitrary number. It is assumed that this ratio is equal to "k". Then, "k" is equal to any integer larger than 3. When the beat angular frequency is equal to $\omega_H/k$, VCO 10 of the PLL circuit shown in FIG. 2 is frequency-modulated by this beat.

A deviation amount of this angular frequency is equal to $\pm \omega_{AC}$ (refer to the equation 4). In accordance with the telecommunication theory, assuming now that a phase modulation amount of a signal which has been frequency-modulated by $\pm \omega_{AC}$ with a sinusoidal wave of an angular frequency having $\omega_H/k$, is equal to $\Delta\phi$, the following equation is satisfied:

$$\pm \Delta\phi = \frac{\pm \omega_{AC}}{\frac{\omega_H}{k}} \qquad (27)$$

If an amount of "$\beta$" represented in FIG. 11 is smaller than $2\Delta\phi$, the waveform shown in FIG. 11 may be replaced by that shown in FIG. 12, so that the condition can escape from the erroneous holding condition. As apparent from FIG. 11, the value of "$\beta$" is equal to the following equation;

$$\beta = \frac{\pi}{k} - X_M \qquad (28)$$

As a consequence, the erroneous holding cancel condition is expressed as follows:

$$|\beta| < 2\Delta\phi$$

$$\therefore \left| \frac{\pi}{k} - X_M \right| < \frac{2k\omega_{AC}}{\omega_H}$$

When the above formula is replaced by $\omega_{AC} = X_M \omega_1$ denoted in the equation (4), the following formula is given:

$$\frac{\pi}{k\left(1 - \frac{2k\omega_1}{\omega_H}\right)} < X_M < \frac{\pi}{k\left(1 + \frac{2k\omega_1}{\omega_H}\right)} \qquad (29)$$

Figure 13:
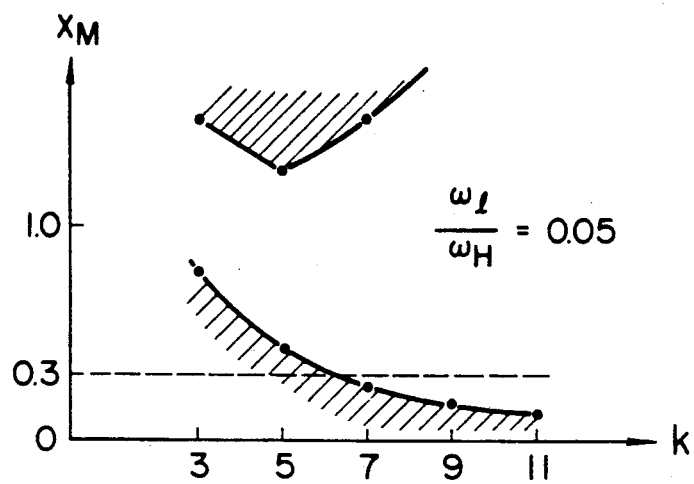
FIGS. 13 and 14 represent an erroneous capture range of a PLL circuit.
Figure 14:
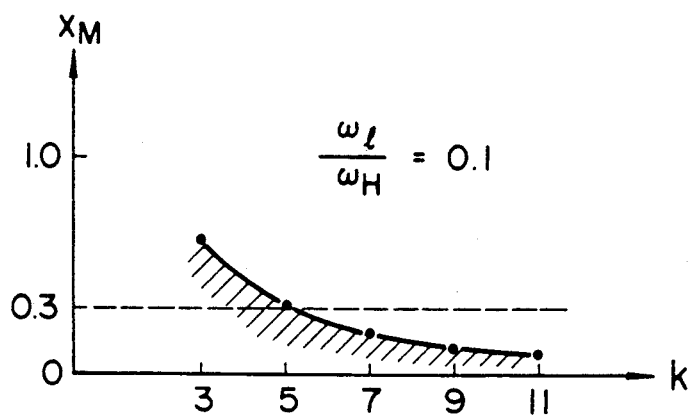

FIGS. 13 and 14 represent the above formula by a graphic representation. FIG. 13 indicates a case of $\omega_1/\omega_H = 0.05$, whereas FIG. 14 represents a case of $\omega_1/\omega_H = 0.1$. A normal display is positioned at an intermediate position of both cases. That is to say, $2X_M$ is nearly equal to 0.6 and $X_M$ is nearly equal to 0.3 in the normal display. As a result, it is normal that the erroneous holding occurrence mode is restricted to a $\omega_H/3$ beat or a $\omega_H/5$ beat.

Based upon results of the above-described analysis the following facts were discovered. If the formula (29) is satisfied with a selected value of $X_M$, the erroneous capture phenomenon can be avoided. However, the value of $X_M$ is normally approximately 0.3 in the practical cases. As a consequence, it is useful to restrict the holding range of the PLL circuit within $\pm \omega_H/5$ by employing a non-linear circuit means.

The quantitative analysis for the capture limit of the general PLL circuit and also another quantitative analysis for the erroneous capture phenomenon have been previously accomplished.

Then, the present invention could be realized based upon results of the above-described quantitative analysis.

Figure 1:
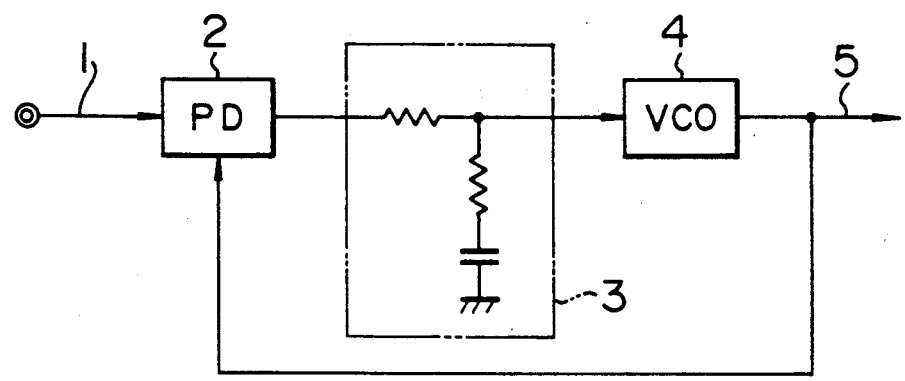
FIG. 1 is a schematic block diagram of the conventional PLL circuit.
Figure 15:
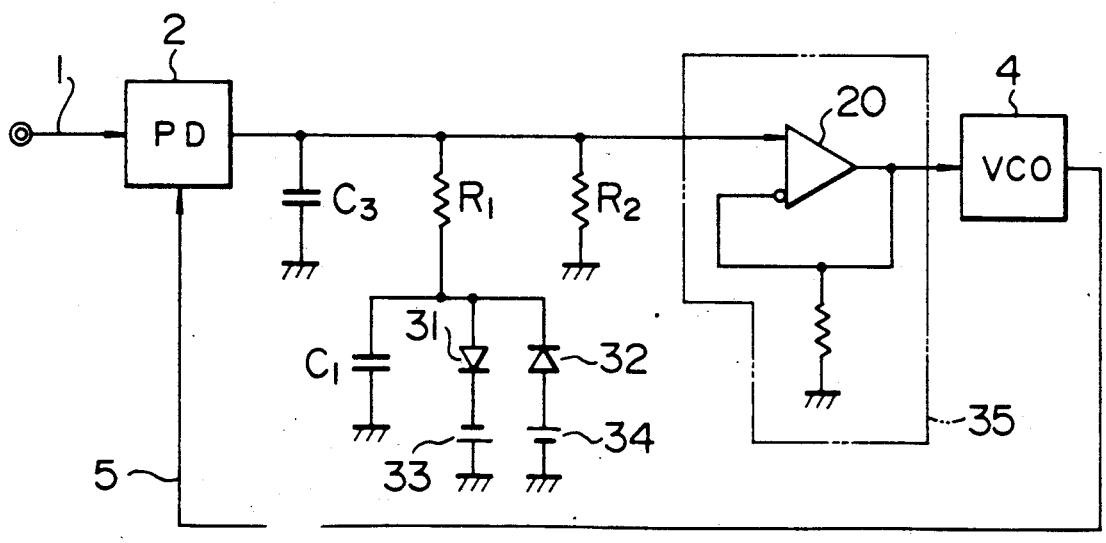
FIG. 15 represents an arrangement of a PLL circuit according to a first preferred embodiment of the present invention.

In FIG. 15, there is shown a PLL circuit arrangement according to a first preferred embodiment of the present invention. Reference numerals 1, 2, 4 and 5 shown in FIG. 15 indicate the same circuit elements shown in FIG. 1. Furthermore, reference numeral 20 indicates the same circuit element of FIG. 8, i.e., an operational amplifier, reference numerals 31 and 32 denote a nonlinear element (diode) functioning as a major portion of an erroneous capture preventing means. Reference numerals 33 and 34 indicate a biasing voltage source, and reference numeral 35 represents a voltage follower.

Figure 16:
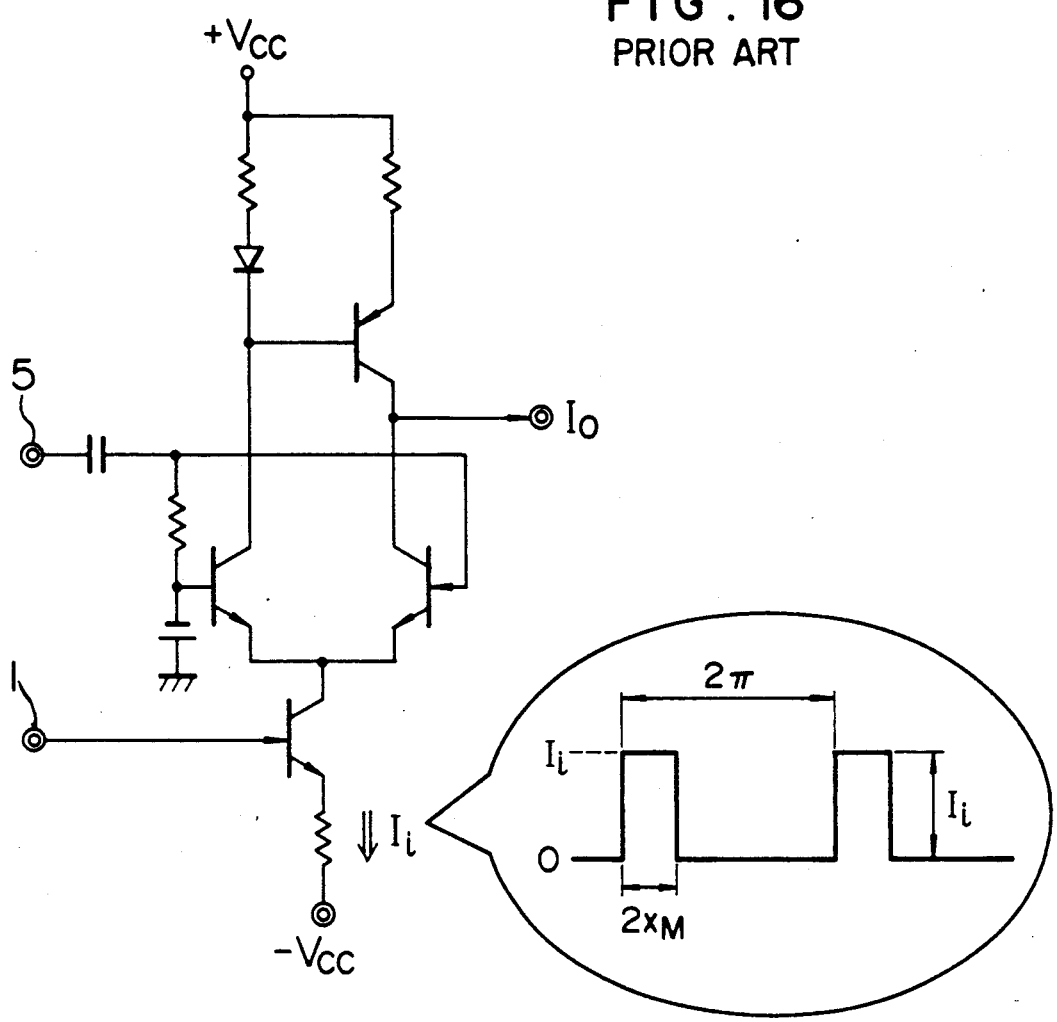
FIG. 16 illustrates a circuit arrangement of a phase detector shown in FIG. 15.

A c8ncrete example of the phase detector 2 shown in FIG. 15 is represented in FIG. 16. Reference numeral 1 shown in FIG. 16 indicates an input horizontal synchronizing signal, the pulse width of which corresponds to $2X_M$ radians. Reference numeral 5 indicates a rectangular wave input having a duty factor of approximately 50%. This is produced as the output from the oscillator 4 shown in FIG. 15. It should be noted that a triangular wave may be employed as this rectangular wave. Since the circuit arrangement of FIG. 16 is well known in the art, a detailed description thereof is omitted.

Assuming now that an average current output shown in FIG. 16 is equal to $I_o$, this is given by the following equation within the region where a phase difference "$X_b$" between the inputs 1 and 5 is $\pm X_M$ radians.

$$\frac{I_o}{X_b} = \frac{I_i}{\pi} \qquad (30)$$

It should be noted that a symbol "$I_i$" indicates a pulsating emitter current shown in FIG. 16. A current $I_o$ is equal to $$\pm I_i \frac{X_M}{\pi}$$

within a region where $X_b$ exceeds $\pm X_M$.

Figure 17:
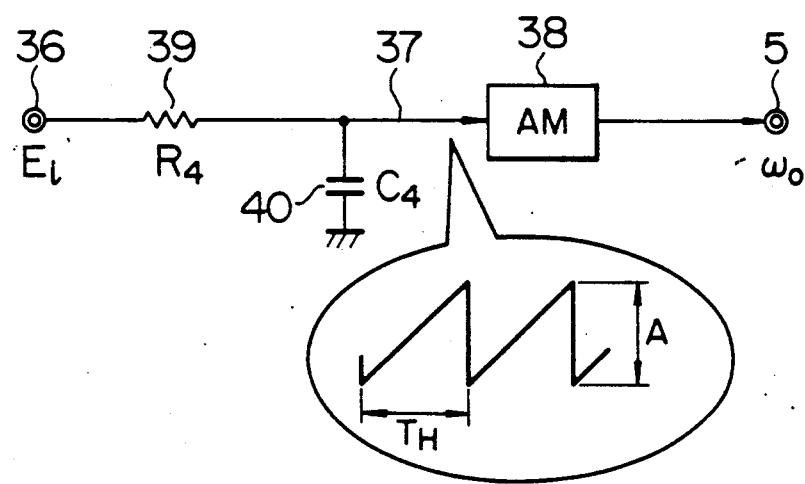
FIG. 17 shows a circuit arrangement of a VCO shown in FIG. 15.

An equivalent circuit example of VCO 4 shown in FIG. 15 is indicated in FIG. 17. In the circuit shown in FIG. 17, reference numeral 36 indicates a VCO input terminal; reference numeral 5 is a VCO output terminal; reference numeral 38 indicates a general-purpose a stable multivibrator; and reference numeral 37 represents an input terminal of this a stable multivibrator from which a triangular oscillation waveform as shown in FIG. 17 appears. A time period of this triangular oscillation waveform is "$T_H$" and a voltage amplitude thereof is "A" Reference numeral 39 indicates a resistor $R_4$ and reference numeral 40 denotes a capacitor $C_4$. A characteristic of deviation "$\omega_o$" in an oscillator output angular frequency with respect to an input voltage $E_i$ of this VCO is given by the following equation:

$$\frac{\Delta \omega_o}{\Delta E_i} = \frac{2\pi}{C_4 R_4 A} \qquad (31)$$

As a result, the original loop gain G1 of the PLL circuit shown in FIG. 15 is obtained from the previously-described equations 21, 30 and 31 under the condition that both the diodes 31 and 32 are turned OFF. Residual phase deviation under such a condition that both the diodes 31 and 32 are turned OFF can be sufficiently made small as follows:

$$G_l = \frac{\Delta I_o}{\Delta X_b} \cdot \frac{E_i}{\Delta I_o} \cdot \frac{\Delta \omega_o}{\Delta E_i} \cdot \frac{1}{p} \approx \frac{I_i}{\pi} \cdot \qquad (32)$$

$$\frac{(1 + \tau_1 p)\frac{R_2}{G_o}}{\left(\frac{1}{G_o} + \tau_1 p\right)(1 + \tau_3 p)} \cdot \frac{2\pi}{C_4 R_4 A} \cdot \frac{1}{p} \approx$$

$$\left(\frac{(1 + \tau_1 p)}{\left(\frac{1}{G_o} + \tau_1 p\right)(1 + \tau_3 p)} \cdot \frac{\omega_l}{p}\right)$$

where $$\begin{cases} G_o = \frac{R_1 + R_2}{R_1}, \Delta G_o = \frac{R_2}{R_1} \\ \tau_1 = C_1 \cdot R_1, \tau_3 = C_3 \cdot R_1, \\ R_2 >> R_1, C_3 << C_1, \\ \omega_l \approx \frac{2I_i R_1}{C_4 R_4 A} \end{cases}$$

Figure 18:
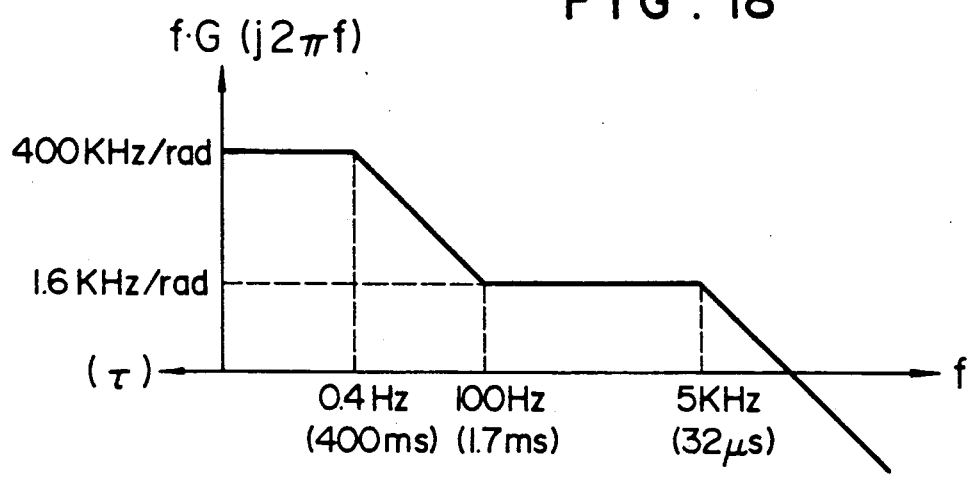
FIG. 18 indicates a Bode diagram of a loop gain for a frequency conversion in the PLL circuit arrangement shown in FIG. 15.

A concrete constant example suitable for such a case that the horizontal frequency is about 16 KHz is represented as follows:
$R_1$: 5.6 kΩ, $R_2$: 1.2 MΩ, $R_4$: 50 kΩ,
$C_1$: 0.33 μF, $C_3$: 5.6 mμF, $C_4$: 2 mμF,
A: 5 Vpp, $I_i$: 0.5 mA, $X_M$=0.30 rad In FIG. 18, there is shown a Bode diagram of a loop gain: f·G1(j2/f) which has been converted into a frequency in the above-described constant example. As apparent from this Bode diagram, a so-called DC loop gain in a lower frequency region: $f_{1DC}$ is very large:

$$f_{1DC} \approx 400 \text{ KHz/rad.}$$

Since a drift in an oscillating frequency of VCO 4 shown in FIG. 15 is smaller than about 500 Hz even in a worst condition, a stationary residual phase difference "ε" is expressed as follows:

$$\epsilon = \frac{\Delta f_o}{f_{ID}} = \frac{500 \text{ Hz}}{400 \text{ kHz}} \text{ rad} \approx 1.3 \text{ m rad} \approx$$

$$\frac{1.3 \text{ m}}{2\pi} \text{ cycle} \approx 0.0002 \text{ cycle}$$

In other words, the residual deviation can be reduced to on the order of 2/10000 horizontal periods so that the display precision of the screen in the horizontal direction can be highly precisely set. This condition corresponds to such a state that both the diodes 31 and 32 are turned OFF in FIG. 15.

In FIG. 15, the biasing voltage sources 33 and 34 are set in such a way that the holding range of the PLL circuit is limited within the previously explained $\omega_H/5$. In the above-described concrete constant example, $\omega_H/5$ corresponds to $2\pi \times 3.2$ KHz. A VCO control sensitivity may be calculated as $2\pi \times 2$ KHz/V by applying a concrete constant to the equation 31. As a result, in FIG. 15, it is preferable to restrict the VCO input voltage within ±1.6 V. Since the voltage gain of the voltage follower 35 is equal to 1, each of the biasing voltage sources 33 and 34 is set to be lower than 1.6 V, for instance, 1.2 V (corresponding to 2.4 KHz). Because the value of the resistor R1 shown in FIG. 15 is much lower than that of the resistor R2, an average value of the VCO input voltage may be limited by this bias voltage. As a consequence, the holding range of the PLL circuit shown in FIG. 15 may be restricted to be smaller than $\pm \omega_H/5$. Thus, the erroneous capture phenomenon can be avoided.

Figure 19:
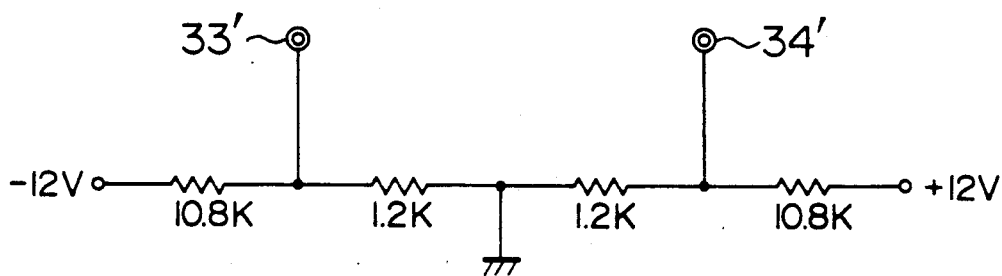
FIG. 19 represents an arrangement of a bias power source circuit shown in FIG. 15.

As a concrete circuit arrangement for the biasing voltage source, such a resistor dividing circuit that an internal resistance thereof is smaller than a resistance value of the resistor R1 may be employed. One concrete example thereof is represented in FIG. 19. Terminals 33' and 34' of FIG. 19 may be utilized as the biasing voltage sources 33 and 34.

The capture range of the PLL circuit shown in FIG. 15 becomes $\pm 2.4$ KHz in accordance with the voltage limit of $\pm 1.2$ V. In the circuit arrangement shown in FIG. 15, although the diodes 31 and 32 are connected in parallel with the AC gain low-frequency capacitor $C_1$, alternatively these diodes may be connected in parallel with the resistor $R_2$. It should be noted that the resultant capture range in the latter case is slightly narrower than $\pm 2.4$ KHz.

The description of the first preferred embodiment of the present invention has been made above.

Summarizing now the PLL circuit according to the first preferred embodiment, the holding range of this PLL circuit may be limited within $\pm 20\%$ of the input frequency by inserting into the transmission path of the loop filter a pair of series circuits each consisting of an element having a diode function and also a biasing power source.

It should be understood that the above-described biasing voltage source is absolutely required in the first preferred embodiment. If no biasing voltage source is employed, an adverse influence may be induced by an internal resistance of a forward-biased diode, and therefore the DC loop gain of this PLL circuit may be lowered. As a result, the stationary residual phase deviation becomes excessive.

Figure 20:
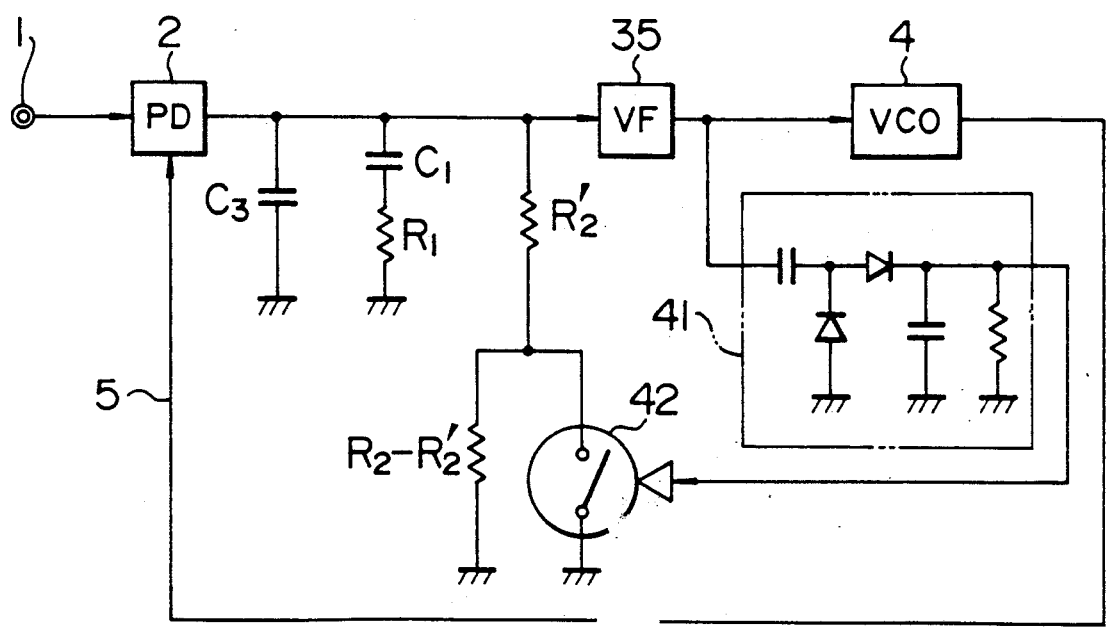
FIG. 20 indicates an arrangement of a PLL circuit according to a second preferred embodiment of the present invention.

FIG. 20 represents a PLL circuit arrangement according to a second preferred embodiment of the present invention. It should be noted that the circuit elements denoted by the same reference numerals shown in FIG. 15 are employed as those having the same functions in FIG. 20. Reference numeral 41 indicates a beat amplitude detector for detecting P—P amplitude P—P value of a beat waveform. A time constant of a detected load is selected to be higher than approximately 10 times the horizontal period. When the PLL circuit is brought into the capture stage or erroneous holding condition, a DC voltage "B" defined by the following equation is outputted from the beat amplitude detector 41:

$$B \approx 2X_M \omega_I \cdot \frac{\Delta E_i}{\Delta \omega_o} = \frac{4X_M I_i R_1}{C_4 R_4 A} \cdot \frac{C_4 R_4 A}{2\pi} = \frac{2X_M I_i R_1}{\pi} \quad (33)$$

In case of the above-described constant example, the DC voltage B is about 0.56 V. Under a condition after the normal capture operation, since no beat is present at the input side of VCO 4, the output of the beat amplitude detector 41 becomes substantially zero. This detector output controls an analog switch (available as a general-purpose IC). Thus, the analog switch 42 is closed/opened in response to presence/absence of this detector output, respectively.

As a result, under such a condition after the normal capture operation, this analog switch 42 is opened. Consequently, this condition is equal to such a condition where the diodes 31 and 32 shown in FIG. 15 are turned OFF. As a consequence, the residual phase deviation can be extremely made small.

On the other hand, since the analog switch 42 is closed under such a state that a beat waveform is present, the resistance value of the resistor $R'_2$ is determined based upon the condition to solve the erroneous holding operation as follows:

For instance, in case of the previously explained $\omega_H/5$ beat condition in FIG. 11, the holding range of the erroneous holding operation may be limited to be smaller than $\omega_H/5$. The DC loop gain of the condition shown in FIG. 11 is deteriorated, namely reduced to be 1/5 of the normal DC loop gain. As a consequence, to restrict the holding range of the erroneous holding operation to be lower than $\omega_H/5$, the holding range of the normal holding substitution may be limited to be smaller than $\omega_H H$.

The holding range $\omega h$ is given by the below-mentioned formulae when the analog switch 42 is closed in FIG. 20.

$$\omega_h \approx \frac{2X_M \cdot I_i \cdot R'_2}{C_4 R_4 A} \quad (34)$$

$$\omega_h < \omega_H$$

$$\therefore R'_2 < \frac{C_4 R_4 A \omega_H}{2X_M \cdot I_i} \quad (35)$$

When the above-described concrete constants are inserted into these formulae, then:

$$R'_2 < \frac{2 \, m\mu F \, 50 \, k\Omega \, 5 \, V \, 2\pi \, 16 \, kHz}{2 \times 0.31 \times 0.5 \, mA} \approx 160 \, k\Omega$$

That is to say, when the resistance value of $R'_2$ is selected to be smaller than approximately 160 K$\Omega$, the erroneous holding operation can be prevented. It should be understood that although the above-described explanation was made to such a case that the beat waveform is present, an erroneous holding operation preventing condition for a general $\omega_H/R$ beat condition is similarly obtained from the formula (35), and the normal holding operation range for the fundamental waveform is within $\pm f_H$.

Accordingly, in accordance with the PLL circuit of the second preferred embodiment, shown in FIG. 20, the stationary residual phase deviation can be sufficiently suppressed and also no erroneous capture trouble occurs. Summarizing now the second preferred embodiment, the erroneous capture beat amplitude detecting means for the PLL circuit is employed, and also such a limiting means is employed that the holding range of the PLL circuit is made lower than the beat frequency by a non-linear circuit (analog switch 42).

Thus, the description of the PLL circuit arrangement of the second preferred embodiment has been completed.

Figure 21:
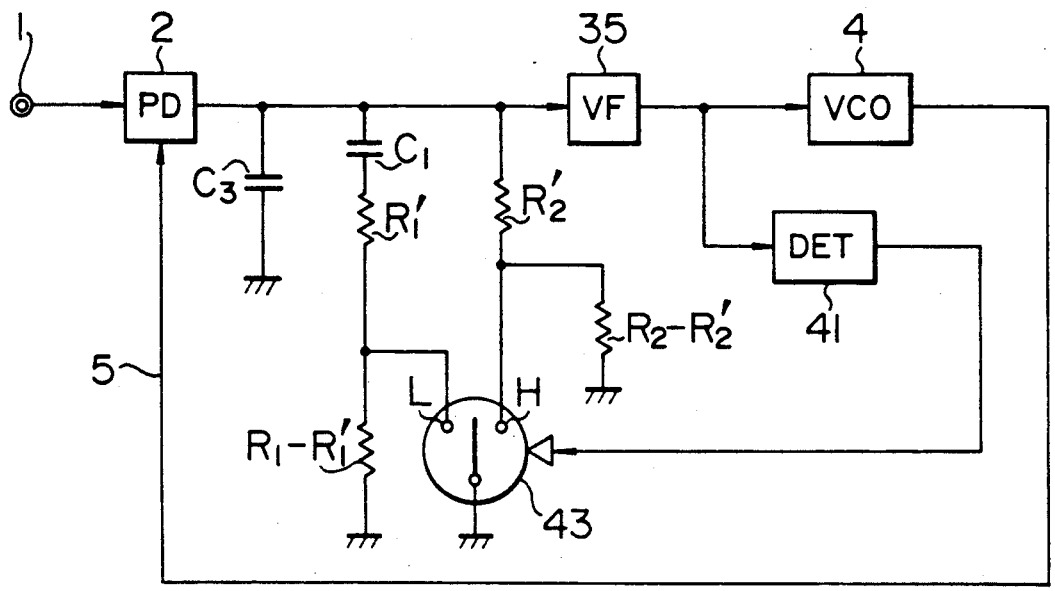
FIG. 21 is an arrangement of a PLL circuit according to a third preferred embodiment of the present invention.

In FIG. 21, there is shown a PLL circuit arrangement according to a third preferred embodiment of the present invention. A major difference from the circuit arrangement shown in FIG. 20 is an analog switch 43 having two contacts. When the output from the beat amplitude detector 41 is large, this analog switch 43 is connected to an H side. This condition is equivalent to such a condition that the analog switch 42 shown in FIG. 20 is closed. On the other hand, when the output from the beat amplitude detector 41 is small, the analog switch 43 is connected to an "L" side. Under this condition, the resistance value $R_1$ is substituted by another resistance value $R'_1$ smaller than this resistance value $R_1$. As a result, there is a particular advantage that the noise characteristic can be improved. In general, the resistance value $R'_1$ is selected to be approximately ⅓ of the resistance value $R_1$ (about 5.6 KΩ), namely 1.8 KΩ.

Figure 22:
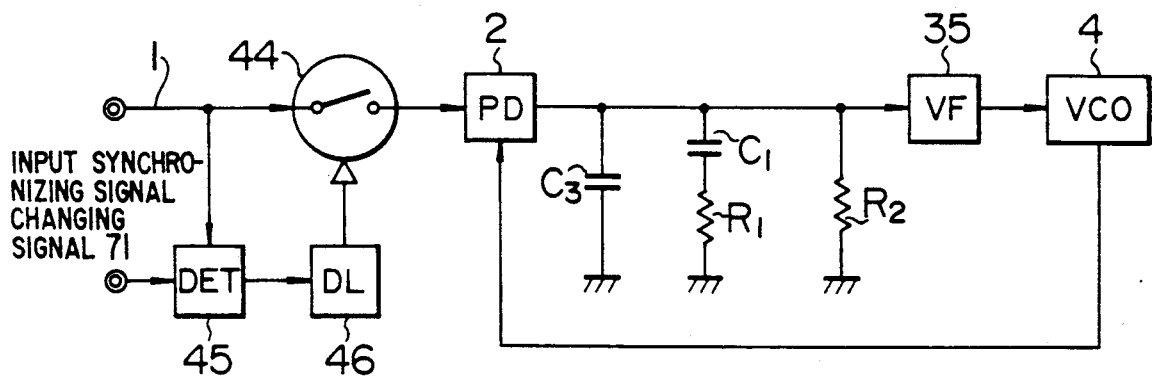
FIG. 22 is an arrangement of a PLL circuit according to a fourth preferred embodiment of the present invention.

The explanation of the PLL circuit according to the third preferred embodiment has been accomplished. FIG. 22 shows a PLL circuit arrangement according to a fourth preferred embodiment of the present invention. A difference of the PLL circuit shown in FIG. 22 is circuit elements 44, 45 and 46, as compared with the circuit arrangement shown in FIG. 20. Reference numeral 45 indicates an amplitude detector having an arrangement similar to that of the beat amplitude detector circuit shown in FIG. 20, and detecting an amplitude of the input horizontal synchronizing signal 1. Reference numeral 46 indicates a delay circuit. A delay time of this delay circuit 46 is selected to be approximately 0.2 seconds which is longer than the rising time of the VCO 4, i.e., approximately 0.1 second when the power switch is turned ON. A detailed circuit arrangement of this delay circuit 46 may be constructed of a monostable multivibrator a low-pass filter. Reference numeral 44 indicates an analog switch. Just after the power switch is turned ON, the output of the delay circuit 46 is maintained at a low level, under which condition, the analog switch is turned OFF. After about 0.2 seconds have passed after the power switch is turned ON, a free oscillating frequency of the VCO 4 has been set to near the normal value. At this time, the output from the delay circuit 46 is changed from a low level into a high level, so that the analog switch 44 is closed. Therefore, the input horizontal synchronizing signal 1 is supplied to the phase detector 2, and the PLL circuit performs the normal capture operation. The major feature of the fourth preferred embodiment is such that the horizontal synchronizing signal inputted to the phase detector is blocked for a predetermined time period longer than the rising time of the VCO after the power switch is turned ON. It should be noted that reference numeral 71 is a changing signal for an input synchronizing signal, which is inputted from an external terminal. In response to this changing signal, the above-described operations are performed as when the power switch is turned ON. The description of the fourth preferred embodiment has been completed.

Figure 23:
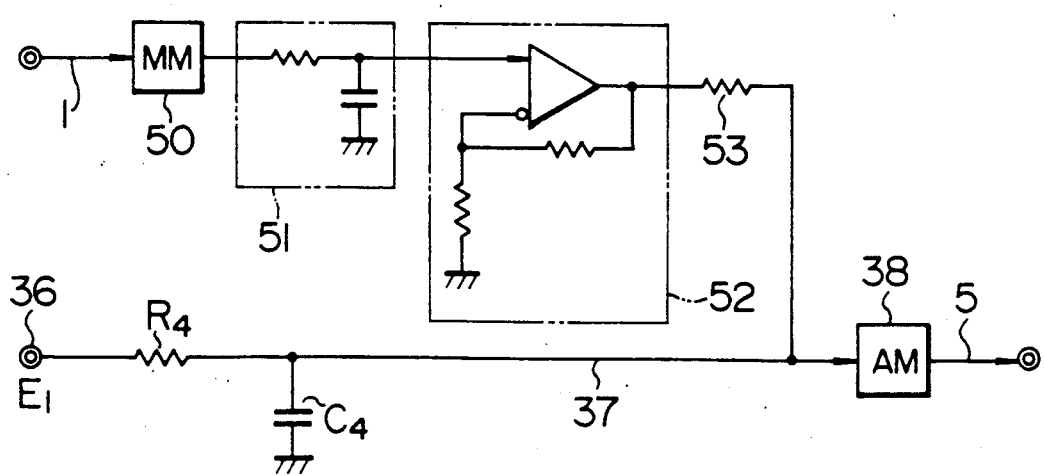
FIG. 23 represents another arrangement of a VCO employed in the PLL circuit arrangements according to the first to fourth preferred embodiments of the present invention.

An arrangement of the VCO 4 is illustrated in FIG. 23, which is suitable for a multi-scanning type display according to the present invention. The arrangement of VCO shown in FIG. 23 includes circuit elements 50, 51, 52 and 53, which is different from the arrangement of the VCO shown in FIG. 17. These circuit arrangements constitute a well known so-called "counter detecting type frequency discriminating circuit". Reference numeral 50 indicates a monostable multivibrator the output pulse width of which is selected to be smaller than a minimum value of a repetition period of the input horizontal synchronizing signal 1. For example, when a range of an input horizontal frequency is from 16 KHz to 100 KHz which is determined by the type of the signal source, the output pulse width of the mono-multivibrator 50 is selected to be approximately 8 microseconds. Reference numeral 51 is a low-pass filter for converting a pulse input into an averaged DC output. This DC output voltage is directly proportional to the repetition frequency of the input horizontal synchronizing signal 1. Reference numeral 52 denotes a voltage amplifier. Reference numeral 53 indicates a resistor for converting voltage into current, the resistance value of which is selected to be substantially equal to the resistance value (about 50 kΩ) of the resistor $R_4$ shown in FIG. 23. Based upon the above-described basic idea of the equation (31), the oscillating frequency of the a stable multivibrator 38 is controlled so as to be substantially equal to the input horizontal frequency depending upon the path of the blocks 50, 51, 52 and 53. The arrangement of the VCO unit shown in FIG. 23 is applied to the VCO units represented in FIGS. 15, 20, 21 and 22. Thus, a PLL circuit applicable to a signal source having a wide range from 16 KHz to 100 KHz of the horizontal scanning frequency can be constructed.

In general, the present invention may be effectively applied to a display requiring high precision display positions. More specifically, the present invention is particularly suitable for a multi-scanning type projector mode display.

Figure 24:
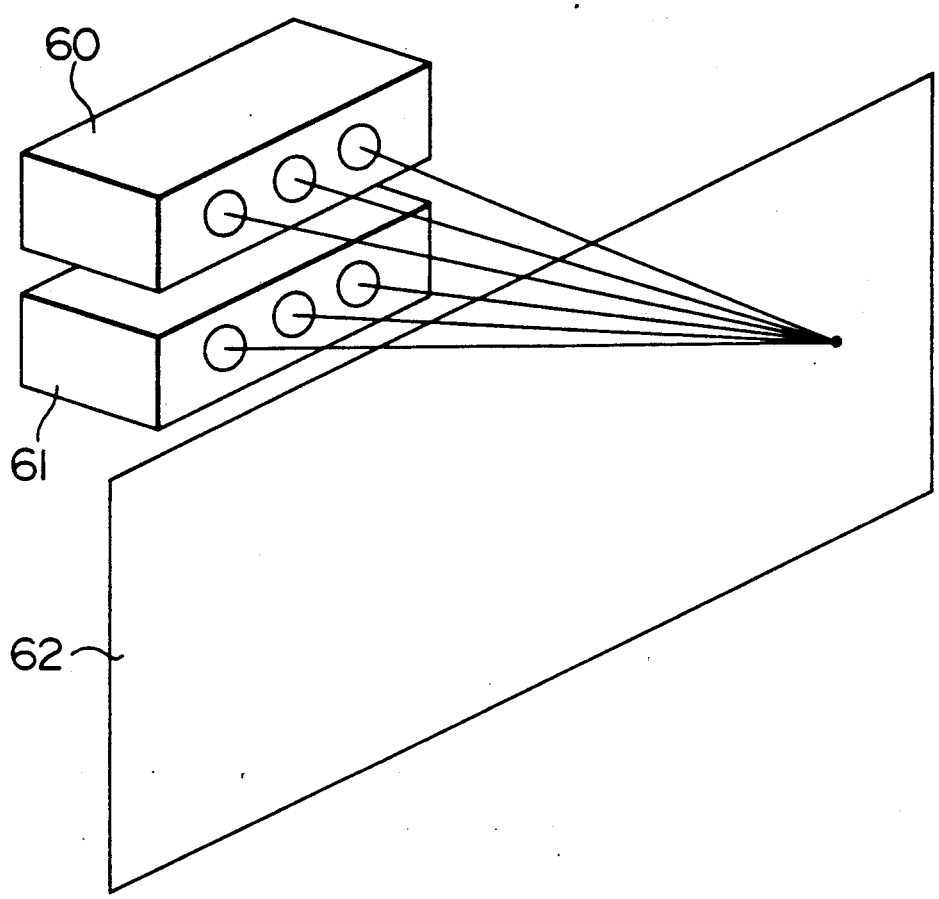
FIG. 24 indicates a multi-projector type display to which the PLL circuit arrangement of the present invention is applied.
Figure 25:
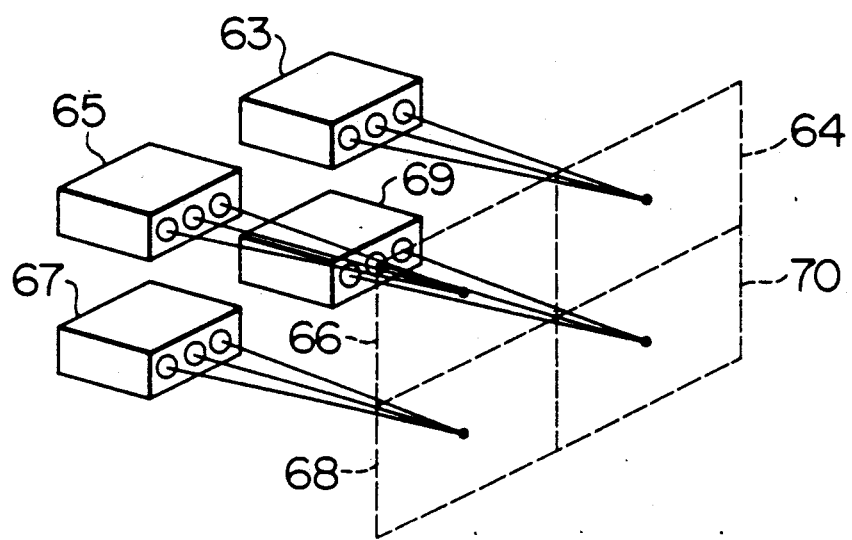
FIG. 25 represents a multi-screen projector type display to which the PLL circuit arrangement of the present invention is applied.

In FIGS. 24 and 25, there are shown examples of products to which the present invention has been effectively applied.

FIG. 24 represents a 6-tube/6-lens type projection mode display. Reference numerals 60 and 61 indicate a 3-tube/3-lens type projector, respectively. The present invention has been applied to a horizontal PLL circuit of the respective 3-tube/3-lens type projector.

FIG. 25 represents a multi-screen projector. Reference numerals 63, 65, 67 and 69 indicate a unit projector, respectively. An image is projected onto each of unit screens 64, 66, 68 and 70 by the respective projectors 63, 65, 67 and 69. These unit screens 64, 66, 68 and 70 are juxtaposed with each other, whereby these unit screens may wholly constitute a single large screen. To minimize a discontinuity occurring at the juxtaposed portions, a horizontal PLL circuit employed in the respective projectors is constructed in accordance with the present invention.

Figure 26:
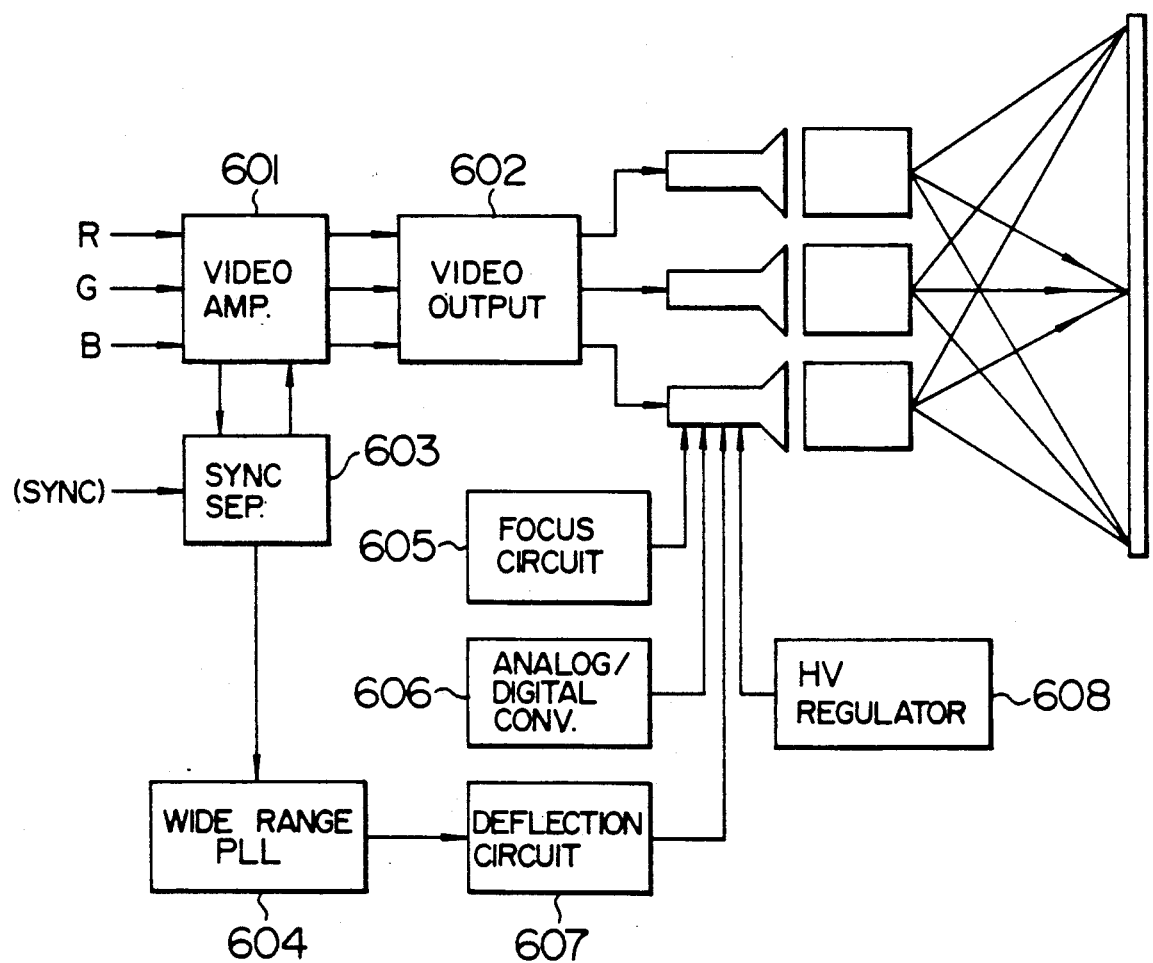
FIG. 26 represents an arrangement of a unit projector shown in FIG. 25.

In FIG. 26, there is shown an internal arrangement of the unit projector. Reference numeral 601 indicates a video amplifier; reference numeral 602 denotes a video output; reference numeral 603 is a sync separator; reference numeral 604 represents a broadband PLL circuit according to the present invention; reference numeral 605 is a focus circuit; reference numeral 606 denotes an analog-to-digital converter; reference numeral 607 indicates a deflection circuit; and reference numeral 608 represents a high-voltage regulator.

In accordance with the present invention, the residual phase deviation occurring in the PLL circuit of the display can be reduced and also the harmful erroneous capture phenomenon can be presented. As a consequence, such a display having a high precision display screen can be manufactured, whereby the present invention can develop industrial merits.

What is claimed is:

1. A high precision PLL (phase-locked loop) circuit arrangement comprising:
   phase detecting means receiving an input synchronizing signal and an oscillator signal for detecting a phase difference between the input synchronizing signal and the oscillator signal and for outputting a phase difference signal representing the detected hase difference;

loop filter means receiving the phase difference signal for delaying the phase difference signal and for outputting the delayed phase difference signal;

voltage-controlled oscillator means receiving the delayed phase difference signal for outputting the oscillator signal which is received by the phase detecting means, the oscillator signal having a frequency which varies in accordance with the delayed phase difference signal; and non-linear circuit means connected to one of the phase detecting means and the loop filter means for preventing an erroneous capture phenomenon of the PLL circuit arrangement due to a $\omega_H/k$ beat in the delayed phase difference signal, wherein $\omega_H$ is an angular frequency of the input synchronizing signal and k is equal to an odd number higher than 3.

2. A high precision PLL circuit arrangement as claimed in claim 1, wherein said non-linear circuit means is connected to said loop filter means and includes two series circuits each consisting of a series connection of a diode and a biasing voltage source connected to said loop filter means, and wherein said non-linear circuit means prevents an erroneous capture phenomenon due to a $\omega_H/5$ beat by limiting a holding range of said PLL circuit arrangement within $\pm 0.2\ \omega_H$.

3. A high precision PLL circuit arrangement as claimed in claim 1, wherein said loop filter means has a DC gain, and wherein said non-linear circuit means is connected to said loop filter means and includes:

a beat amplitude detecting circuit receiving the delayed phase difference signal for detecting if a beat amplitude is present in the delayed phase difference signal; and an analog switch responsive to the beat amplitude detecting circuit for changing the DC gain of said loop filter means;

wherein when said beat amplitude detecting circuit detects that a beat amplitude is present in the delayed phase difference signal, said analog switch reduces the DC gain of said loop filter means so as to limit a holding range of the PLL circuit arrangement within $\pm\omega_H/5$, and when said beat amplitude detecting circuit detects that a beat amplitude is not present in the delayed phase difference signal, said analog switch increases the DC gain of said loop filter means.

4. A high precision PLL circuit arrangement as claimed in claim 3, wherein said loop filter means has an AC gain, and wherein when said beat amplitude detecting circuit detects that a beat amplitude is present in the delayed phase difference signal, said analog switch increases the AC gain of said loop filter means, and when said beat amplitude detecting circuit detects that a beat amplitude is not present in the delayed phase difference signal, said analog switch reduces the AC gain of said loop filter means.

5. A high precision PLL circuit arrangement as claimed in claim 1, wherein said non-linear circuit means is connected to said phase detecting means and block the input synchronizing signal from being received by said phase detecting means during a transient time period after a power switch of the PLL circuit arrangement is turned on until a free oscillating frequency of said voltage-controlled oscillator means is set to near a normal value.

6. A high precision PLL circuit arrangement as claimed in claim 1, wherein said non-linear circuit means is connected to said phase detecting means and receives an input synchronizing signal changing signal, and blocks the input synchronizing signal from being received by said phase detecting means during a transient time period after receipt of the input synchronizing signal changing signal until a free oscillating frequency of said voltage controlled oscillator means is set to near a normal value.

7. A projection type display apparatus comprising:
means for generating a horizontal synchronizing signal;

a high precision PLL circuit arrangement as defined in claim 1, the phase detecting means of the PLL circuit arrangement receiving the horizontal synchronizing signal as the input synchronizing signal; and horizontal deflection means receiving the oscillating signal output by the voltage-controlled oscillator means of the PLL circuit arrangement.

8. A high precision PLL (phase-locked loop) circuit arrangement comprising:

phase detecting means receiving a horizontal synchronizing signal and an oscillating signal for producing a detection signal which is directly proportional to a phase difference between said horizontal synchronizing signal and said oscillating signal;

loop filter means receiving the detection signal from said phase detecting means for delaying the detection signal according to a predetermined time constant to produce a delayed signal;

voltage-controlled oscillator means receiving the delayed signal from said loop filter means for producing the oscillating signal which is received by said phase detecting means, the oscillating signal having a frequency which is directly proportional to a voltage of the delayed signal;

beat amplitude detecting means receiving the delayed signal from said loop filter means for detecting an amplitude of a beat in the delayed signal; and non-linear circuit means, including a non-linear element, for changing an AC gain of said loop filter means in response to the amplitude detected by said beat amplitude detecting means, said non-linear circuit means preventing an erroneous capture phenomenon of the PLL circuit arrangement due to the beat in the delayed signal.

9. A high precision PLL (phase-locked loop) circuit arrangement comprising:

phase detecting means receiving a horizontal synchronizing signal and an oscillating signal for producing a detection signal which is directly proportional to a phase difference between said horizontal synchronizing signal and said oscillating signal;

loop filter means receiving the detection signal from said phase detecting means for delaying the detection signal according to a predetermined time constant to produce a delayed signal;

voltage-controlled oscillator means receiving the delayed signal from said loop filter means for producing the oscillating signal which is received by said phase detecting means, the oscillating signal having a frequency which is directly proportional to a voltage of the delayed signal;

beat amplitude detecting means receiving the delayed signal from said loop filter means for detecting an amplitude of a beat in the delayed signal; and non-linear circuit means, including a non-linear element, for changing a DC gain of said loop filter means in response to the amplitude detected by said beat amplitude detecting means, said non-linear circuit means preventing an erroneous capture phenomenon of the PLL circuit arrangement due to the beat in the delayed signal.

10. A high precision PLL (phase-locked loop) circuit arrangement comprising:

phase detecting means receiving a horizontal synchronizing signal and an oscillating signal for producing a detection signal which is directly proportional to a phase difference between said horizontal synchronizing signal and said oscillating signal;

loop filter means receiving the detection signal from said phase detecting means for delaying the detection signal according to a predetermined time constant to produce a delayed signal;

voltage-controlled oscillator means receiving the delayed signal from said loop filter means for producing the oscillating signal which is received by said phase detecting means, the oscillating signal having a frequency which is directly proportional to a voltage of the delayed signal;

beat amplitude detecting means receiving the delayed signal from said loop filter means for detecting an amplitude of a beat in the delayed signal; and non-linear circuit means, including a non-linear element, for changing a DC gain and an AC gain of said loop filter means in response to the amplitude detected by said beat amplitude detecting means, said non-linear circuit means preventing an erroneous capture phenomenon of the PLL circuit arrangement due to the beat in the delayed signal.

11. A high precision PLL (phase-locked loop) circuit arrangement comprising:

phase detecting means receiving a horizontal synchronizing signal and an oscillating signal for producing a detection signal which is directly proportional to a phase difference between said horizontal synchronizing signal and said oscillating signal;

loop filter means receiving the detection signal from said phase detecting means for delaying the detection signal according to a predetermined time constant to produce a delayed signal;

voltage-controlled oscillator means receiving the delayed signal from said loop filter means for producing the oscillating signal which is received by said phase detecting means, the oscillating signal having a frequency which is directly proportional to a voltage of the delayed signal; and non-linear circuit means for preventing an erroneous capture phenomenon of the PLL circuit arrangement due to a beat in the delayed signal, said non-linear circuit means including:

an amplitude detecting circuit responsive to said horizontal synchronizing signal or a synchronizing signal changing signal for producing a detection signal;

a delay circuit for delaying the detection signal from the amplitude detecting circuit for a predetermined time period until the oscillating signal from said voltage-controlled oscillator means becomes stable to produce a delayed detection signal; and a switch for applying said horizontal synchronizing signal to said phase detecting means in response to the delayed detection signal from the delay circuit.

* * * * *